United States Patent

Lootens et al.

[15] 3,706,915

[45] Dec. 19, 1972

[54] SEMICONDUCTOR DEVICE WITH LOW IMPEDANCE BOND

[72] Inventors: William F. Lootens; Joseph K. Flowers, both of Skaneateles, N.Y.

[73] Assignee: General Electric Company

[22] Filed: March 9, 1970

[21] Appl. No.: 17,713

[52] U.S. Cl..........317/234 R, 317/234 N, 317/234 E, 317/234 G, 29/589

[51] Int. Cl.................................................H01l 5/02

[58] Field of Search............317/234, 5.3, 5.4, 5, 1, 4; 29/489, 500, 501, 503, 591, 589

[56] References Cited

UNITED STATES PATENTS

| | | | |
|---|---|---|---|
| 3,062,981 | 11/1962 | Stoeckert et al. | 313/289 |
| 3,291,578 | 12/1966 | Fahey | 29/195 |
| 3,449,173 | 6/1969 | Rupprecht et al. | 136/205 |

*Primary Examiner*—John W. Huckert
*Assistant Examiner*—E. Wojciechowicz
*Attorney*—Robert J. Mooney, Nathan J. Cornfeld, Carl O. Thomas, Frank L. Neuhauser, Oscar B. Waddell and Joseph B. Forman

[57] ABSTRACT

A semiconductor device is formed by scoring a conductive surface of a substrate and locating a semiconductive element over a portion of the capillary formed by scoring. Solder in molten form is associated with the portion of the capillary remote from the semiconductive element and is drawn by the capillary under the semiconductive element to form a tenacious, low impedance interconnection therewith. The substrate may be a dielectric or a metal heat sink. Leads may be secured to the substrate similarly as the semiconductive element is secured. A dielectric substrate may be similarly secured to a metal heat sink. Multiple interconnecting or parallel capillaries may be employed. The capillaries may be provided with a remote interconnection, an interconnection for solder receipt, or an indicator portion remote from solder receipt. Plural semiconductive elements may be mounted to a single substrate with solder fed to the semiconductive elements simultaneously or sequentially. On a dielectric substrate the semiconductive elements may be electrically isolated by removing a conductive surface portion after soldering. The capillaries may also take the form of apertures.

5 Claims, 11 Drawing Figures

INVENTORS:
WILLIAM F. LOOTENS,
JOSEPH K. FLOWERS,

BY Carl O. Thomas
THEIR ATTORNEY.

INVENTORS:
WILLIAM F. LOOTENS,
JOSEPH K. FLOWERS,
BY [signature]
THEIR ATTORNEY.

INVENTORS:
WILLIAM F. LOOTENS,
JOSEPH K. FLOWERS,
BY Carl O. Thomas
THEIR ATTORNEY.

SEMICONDUCTOR DEVICE WITH LOW IMPEDANCE BOND

Our invention relates to semiconductor devices which have tenacious, low impedance, relatively oxide free solder interconnections and to a process for their fabrication.

As is well understood in the art, semiconductive elements may be mounted to a substrate by providing the substrate with a conductive surface portion and forming a contact on the semiconductive element surface desired to be attached to the substrate. The semiconductive element is attached to the substrate conductive surface portion by a conventional soldering technique. For example, a liquid solder ball is placed on the substrate and the semiconductive element to be joined thereto is immediately placed on top of the solder ball. As the solder cools it joins the semiconductive element contact to the conductive surface portion of the substrate. According to an alternate technique the semiconductive element is positioned over the conductive surface portion of the substrate with a solder preform interposed. These three elements may then be heated together to the softening point of the solder preform to achieve soldering.

While these soldering techniques are almost universally used in mounting semiconductive elements, we have observed that many solder interconnections, particularly where relatively large surface areas are being joined, produce excessively high thermal impedances and voltage drops in device operation. Further, in many instances the solder may fail to make an adequate mechanical bond, with the result that semiconductive elements may be only partially bonded to a substrate. For example, we have observed that semiconductive elements frequently may be popped loose from a substrate after being soldered thereto when only a slight stress is applied. The difficulty of achieving a good solder bond has also been noted to increase as the area to be bonded, so that the difficulty of poor solder connections is most frequently observed in connection with attempting to solder power level semiconductive elements to heat sinks and in attempting to mount semiconductive elements to dielectric substrates.

Upon inspection of numerous defective solder joints for power level semiconductive elements we have concluded that a prime difficulty in forming tenacious, low impedance ohmic solder interconnections to semiconductive elements is attributable to the tendency of ordinary solders to form surface oxides. The oxidized surface of the molten solder frequently masks the relatively oxide free solder therebeneath from direct association with the semiconductive element. The result can range from a semiconductive element that can be readily physically loosened from the substrate on which it is mounted to a semiconductive element interconnection whose defectiveness, though not physically observable, appears at high thermal impedance or a high voltage drop in the semiconductor device in which it is incorporated.

It is an object of our invention to provide a semiconductor device having a novel interconnection between a substrate and a semiconductive element which forms a tenacious, low impedance bond and which produces a minimal voltage drop thereacross.

It is a further object of our invention to provide a semiconductor device having a solder joint that is relatively oxide free.

It is an additional object to provide a process for fabricating a semiconductor device having a tenacious, low impedance solder joint.

These and other objects of our invention are accomplished in one aspect by a semiconductor device comprised of substrate means providing a conductive surface portion and a semiconductive element having a first major surface with a contact associated therewith. Capillary means extend from a point remote from the semiconductive element to a location interposed between the substrate means and the semiconductive element. Solder means are located within the capillary means and bond the contact to the substrate means.

In another aspect, our invention relates to a process of fabricating a semiconductor device which is comprised of providing a capillary in a support member for a semiconductive element. A semiconductive element is located with a contact attached thereto so that the contact overlies a portion of the capillary and a portion of the capillary extends laterally beyond the semiconductive element. Solder in molten form is provided in the laterally extending portion of the capillary remote from the semiconductive element. A relatively oxide free portion of the solder is segregated and laterally distributed beneath the semiconductive element by capillary action. A portion of the solder is transferred from the capillary portion overlaid by the semiconductive element to a location between the semiconductive element contact and the support member to form a tenacious, low impedance bond therebetween.

Our invention may be better understood by reference to the following detailed description considered in conjunction with the drawings, in which FIG. 1 is a partially schematic sectional view of a semiconductor device;

In the figures the thickness of the semiconductive elements are exaggerated as compared to their width for ease of illustration. Additionally, cross hatching is omitted from the semiconductive elements to avoid cluttering the drawings.

Figure 1:
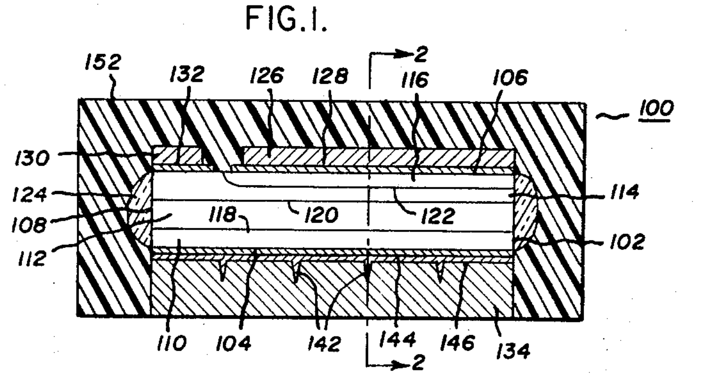
Figure 2:
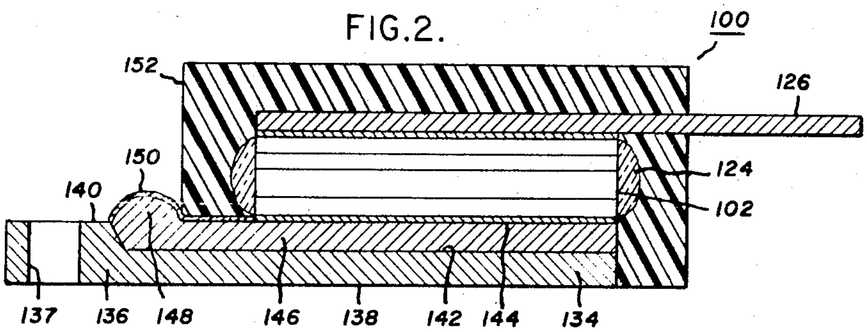
FIG. 2 is a section taken along section line 2—2 in FIG. 1.

In FIGS. 1 and 2 a semiconductor device 100 is shown comprised of a thyristor semiconductive element 102. The semiconductive element is formed with a first major surface 104 and a parallel, opposed major surface 106, the major surfaces being joined by a peripheral edge 108. The semiconductive element is typically formed of a monocrystalline semiconductive material, preferably silicon. As shown, the semiconductive element is formed into four sequentially arranged zones 110, 112, 114, and 116. Zones 110 and 114 are of a first conductivity type while zones 112 and 116 are of an opposite conductivity type. Adjacent zones form P-N junctions therebetween. A junction 118 is formed between zones 110 and 112; a junction 120 is formed between zones 112 and 114; and a junction 122 is formed between zones 114 and 116. In the preferred form the zones 110 and 114 are of P type conductivity while the zones 112 and 116 are of N type conductivity. In this form the zone 110 forms an anode emitter layer, the zone 112 an anode base layer, the zone 114 a cathode base layer, and the zone 116 a cathode emitter layer. The junction 120 represents the forward current blocking junction of the semiconductive element while the junction 118 may be relied upon to block current flow in the opposite direction. To protect and passivate the junctions 120 and 118 at the edge of the semiconductive element a body of passivant 124 is associated with the peripheral edge of the semiconductive element. Typically the passivant is formed of glass, silicone polymer, epoxy resin, etc.

To provide an external ohmic connection to the cathode emitter layer a cathode lead 126 is ohmically conductively associated with the cathode emitter layer by a bonding layer 128. For gate triggering of the device a gate lead 130 is bonded in ohmic conductive relation to the cathode base layer by a bonding layer 132. The bonding layers 130 and 132 may be of any conventional construction and normally each will be made up of a layer of solder and one or a combination of metal layers associated with the leads and the semiconductive element major surface 106.

A heat sink 134 is provided for withdrawing current from the anode emitter layer of the semiconductive element and for withdrawing heat from the entire semiconductive element. To provide maximum efficiency in heat removal the heat sink is at least coextensive with the first major surface of the semiconductive element and also includes a laterally extending integral tab 136 having an aperature 137 therein for mounting the device and transferring heat and current therefrom. In the form shown the heat sink is formed with a first major planar surface 138 intended to cooperate with a heat receiving mounting member. A second major surface 140 is located parallel to the first major surface.

A plurality of parallel grooves 142 open toward the second major surface. Each groove extends beneath the semiconductive element and laterally therebeyond. The first major surface of the semiconductive element is provided with a coextensive contact 144 associated therewith. The contact may be any conventional metal layer or combination of metal layers associated with the semiconductive element for purposes of facilitating formation of an ohmic contact with the anode emitter layer. The contact is typically quite thin, ranging from a few hundred Angstroms to a few mils. The contacts may be applied to the surface of the semiconductive element by vapor plating, sputtering, electroless deposition, etc. To tenaciously bond the semiconductive element to the heat sink a solder 146 is located in the grooves. In the area overlain by the semiconductive element the solder also extends laterally so that it is at every point interposed between the contact and the heat sink providing a bond therebetween. The solder is also located in the portions of the grooves which extend laterally beyond the semiconductive element.

In FIG. 2 a protrusion 148 of solder above the second major surface 140 of the heat sink is shown which corresponds to the situs of solder application to the groove. A thin coating 150 of exaggerated thickness is shown overlying the surface of the solder remote from the semiconductive element. To complete the device a molded housing 152 is provided.

The composition of the various elements making up the semiconductor device are conventional and form no part of our invention. Typically the leads and heat sink are formed of a highly thermally and electrically conductive metal, such as copper, nickel or silver plated copper, aluminum, etc. In a preferred embodiment the contacts 128, 132, and 144 are formed of a think layer of chromium next adjacent the semiconductive element which is superimposed by a layer of nickel which is in turn superimposed by a layer of gold or silver. Many other metals suitable for use singly or in combination as contacts are known, such as aluminum, gold, vanadium, platinum metals, etc. A wide variety of solder metals and solder metal alloys capable of melting at a temperature sufficiently low to avoid degradation of the semiconductive element are known. Suitable conventional solders include lead-tin alloys, silver-lead alloys, and combinations of these alloys with indium, gallium, antimony, gold, germanium, and bismuth. The thin coating 150 may take the form of a thin oxide crust formed by exposure of the solder surface to air or an oxygen rich portion of the solder, whereas the remainder of the solder, particularly the portion underlying the semiconductive element, is by comparison relatively free of oxides or oxygen.

The very minute mating disuniformities in the contact 144 and the second major surface 140 of the heat sink allow a very small spacing to occur between the contact 144 and the heat sink. This minute spacing is considerably narrower than the adjacent width of the grooves. Accordingly, these spaces exert a capillary attraction for the solder which exceeds the capillary attraction exerted by the grooves. A portion of the solder then flows from the grooves and spreads laterally so that the solder is spread to cover the entire surface of the contact 144. As the solder cools it forms a tenacious, low impedance bond between the contact 144 and the heat sink. By reason of our unexpected discovery that the oxygen contaminated portion of the solder can be selectively segregated there is no tendency of the solder to form a mechanically weak or high electrical and/or thermal impedance connection between the semiconductive element and heat sink. Further, we have observed that a tenacious, low impedance bond is obtainable, even when the semiconductive element is of substantial lateral extent, as is typical of power semiconductive elements.

The leads 126 and 130 may be attached to the semiconductive element by conventional techniques before, after, or concurrently with soldering the semiconductive element to the heat sink. After the leads and heat sink have been attached, the housing 152 may be molded around the semiconductive element, leads, and heat sink to form the completed device.

The semiconductor device 100 may be fabricated according to our invention by initially forming the semiconductive element 102 with the passivant 124 and at least contact 144 associated therewith. To bond the semiconductive element to the heat sink 134 so that a tenacious, low impedance ohmic attachment is made to the anode emitter layer the semiconductive element is positioned as shown on the second major surface 140 of the heat sink so that a portion of the grooves 142 extend beneath the semiconductive element while a remaining portion of the grooves extend laterally away from the semiconductive element toward the integral tab 136. At this time the grooves contain no solder beneath the semiconductive element.

Holding the semiconductive element in the desired position with respect to the heat sink, one or more balls of solder are positioned on the heat sink so as to contact each groove portion next adjacent to the tab. By reason of their small size the grooves (which for ease of illustration are exaggerated in size) draw the solder when it is melted on heating thereinto by capillary action and the solder is distributed over the entire length of the grooves. Only the relatively oxide free portion of the solder which has not been directly exposed to oxygen in the ambient atmosphere is drawn into the capillary grooves, however. The oxidized or high oxygen content surface portion of the solder forms a relatively immobile coating or layer 150 that lacks the fluidity to be drawn into the grooves to a location beneath the semiconductive element. The result is that only relatively oxygen free solder reaches the area beneath the semiconductive element.

It is to be noted that, even though it is conventional practice to heat the elements for soldering in a reducing or inert atmosphere to reduce surface oxidation not only of the solder but also the semiconductive element and heat sink, the high affinity of molten solder for oxygen produces oxygen contamination of the solder surface in the laterally extending portions of the grooves even when only small quantities of oxygen are present. Further, the solder surface is usually oxygen contaminated even before heating occurs.

Figure 3:
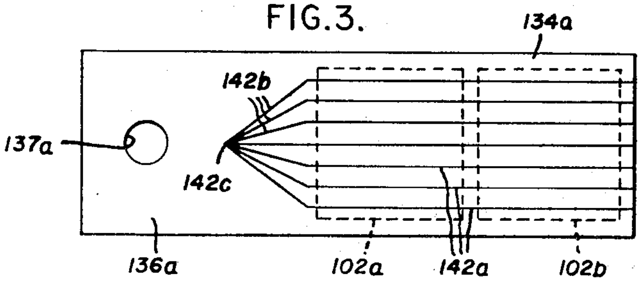
FIG. 3 is a plan view of a modified grooved heat sink.

Additional advantages of our invention may be appreciated by reference to FIG. 3. A heat sink 134*a* is illustrated which is similar to the heat sink 134, except that it is intended to mount two semiconductive elements 102*a* and 102*b*, shown in dashed outline. The heat sink is shown provided with an integral tab portion 136*a* having an aperature 137 therein for mounting the heat sink. A plurality of parallel groove portion 142*a* are provided in the heat sink similar to grooves 142. The grooves differ, however, in being provided with converging portions 142*b* adjacent the tab meeting at a point of convergence 142*c*.

The advantage of the embodiment shown in FIG. 3 is that a single solder ball positioned at the point of convergence 142*c* of the grooves can be relied upon to simultaneously solder both semiconductive elements 102*a* and 102*b* to the heat sink in a manner similar to that described with reference to semiconductive element 102. It is to be further noted that the grooves are formed so that visual inspection can ascertain that the solder has traversed the entire length of the grooves. For example, after soldering is completed, inspection of the groove portions between the semiconductive elements can ascertain that solder has passed through the groove portions underlying the semiconductive element 102*a* and has traveled to the semiconductive element 102*b*. Similar inspection of the groove portions extending from the semiconductive element 102*b* on the side of this element remote from the tab shows whether the solder has traversed the groove portions underlying the semiconductive element 102*b*. If, for example, the groove portions between the semiconductive elements 102*a* and 102*b* are not filled with solder, it is apparent that insufficient solder has been applied to the point of convergence and the unit can either be scrapped or reworked, thus avoiding the expense of building a complete unit which may prove defective on test prior to sale. While the embodiment of FIG. 3 is shown applied to the bonding of two semiconductive elements to a single heat sink, it is appreciated that the same approach may be applied to the bonding of any number of elements. Further, it is apparent that the embodiment of FIG. 3 offers advantages over the embodiment of FIGS. 1 and 2 in allowing for the filling of all grooves with a single solder ball and allowing for visual inspection on the remote side of the semiconductive element. These advantages can be obtained with the embodiment of FIG. 3 even when only one semiconductive element is to be bonded to the heat sink.

Figure 4:
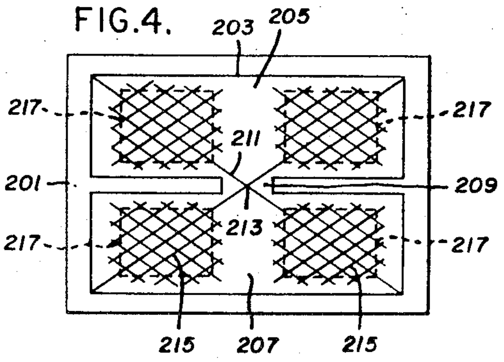
FIG. 4 is a plan view of a grooved substrate.

While the embodiment of FIG. 3 shows an arrangement for sequentially supplying solder to semiconductive elements from a single point of application, the embodiment of FIG. 4 shows the application of our invention to the simultaneous and parallel soldering of semiconductive elements. In FIG. 4 a dielectric substrate 201 is provided with a conductive layer 203 on one major surface. The conductive layer is shown formed of first lobe 205 and a second lobe 207 centrally connected at 209. Primary grooves 211 are formed in the conductive layer with a central point of intersection 213. The primary grooves intersect secondary grooves 215 of lesser size which are arranged in an intersecting grid pattern of somewhat greater lateral extent than the areal portions 217 shown in dashed outline which are intended to underlie and be bonded to semiconductive elements.

When semiconductive elements are located to overlie the areal portions 217, a single solder ball positioned at the central point of intersection 213 feeds solder to each areal portion through the primary grooves 211. Upon reaching the secondary grooves 215 the solder readily transfers to these grooves owing to the greater capillary attraction of smaller grooves. In like manner some of the solder leaves the secondary grooves and fills the interstices between the semiconductive elements to be bonded and the conductive layer to form uniform tenacious bonds over the entire areal portions 217. Since the grooves extend somewhat laterally beyond the semiconductive elements, visual inspection can readily ascertain whether the solder has been properly and adequately distributed.

Instead of using a dielectric substrate 201, it is appreciated that a metal heat sink could be readily substituted. A dielectric substrate offers a distinct advantage in permitting the semiconductive elements to be readily electrically isolated from each other. For example, the semiconductive elements associated with the lobes 205 and 207 can be readily isolated from each other merely by removing the central connecting portion 209 after soldering. This can be done mechanically by sawing or lapping or chemically by etching. It is appreciated that each semiconductive element may be initially partially isolated by a lobe which can be selectively separated from the remaining lobes. Alternately, the conductive layer may be initially unitary and without lobes, although the removal of a greater proportion of the conductive layer would be required to achieve separation, if desired.

Figure 5:
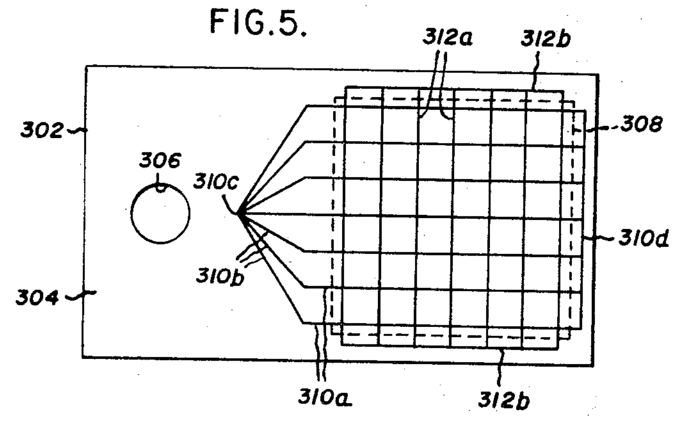
FIG. 5 is a plan view of an additional grooved heat sink.
Figure 7:
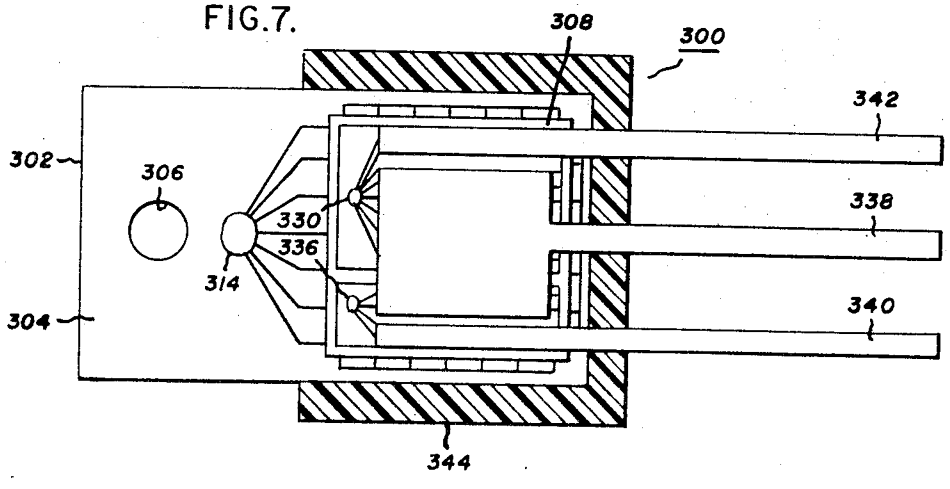
FIG. 7 is a plan view, with the insulative housing broken away, of a semiconductor device formed from the combination of the heat sink and the dielectric substrate of FIG. 6.

In FIG. 7 a semiconductor device 300 is illustrated. The device is comprised of a heat sink 302, which is shown in FIG. 5 as it appears prior to fabrication of the device. The heat sink is planar and provided with an integral tab 304 having an aperture 306 therein for mounting. Fabrication of the semiconductor device 300 is connected by bonding to the heat sink surface in low thermal impedance relation a thermally conductive, electrically insulative dielectric substrate 308, shown in dashed outline in FIG. 5. The dielectric substrate is preferably formed of a material such as beryllia or alumina known to be electrically insulative while possessing a thermal conductivity considerably better than that of most insulators.

To facilitate soldering of the dielectric substrate to the heat sink a plurality of grooves are formed in the major surface of the heat sink. As shown a first set of parallel groove portions **310*a* are provided and interconnect with a converging set of groove portions 310*b* that unite at a point of convergence 310*c*. At their extremities remote from the point of convergence the first set of groove portions are joined by an indicator and relief groove portion 310*d*. A second set of parallel groove portions 312*a* perpendicularly intersect the first set of groove portions. Indicator and relief groove portions 312*b*** intersect the second set of groove portions at the opposite extremities thereof. The indicator and relief groove portions all fall outside the area subtended by the dielectric substrate.

Figure 6:
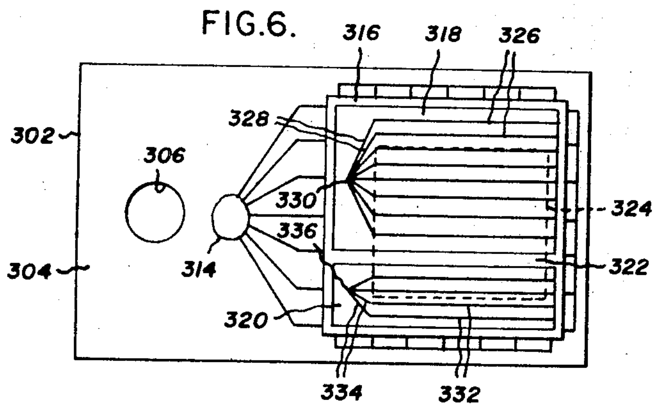
FIG. 6 is a plan view of the grooved substrate of FIG. 5 with a dielectric substrate mounted thereon.

In bonding the dielectric substrate to the heat sink the major surface of the substrate to be bonded is preferably provided with a metallized surface layer, not shown, which may be identical in construction to a semiconductive element contact. The surface metallization facilitates bonding similarly as in the soldering of a semiconductive element. With the dielectric substrate in the position indicated by dashed outline in FIG. 5 solder initially positioned at the point of convergence **310*c* is melted so that it is readily distributed by capillary and gravitational forces through the interconnected matrix of grooves, flowing first through the groove portions 310*b* to the first set of parallel groove portions 310*a* to the second set of parallel groove portions 312*a*. Solder is also drawn by capillary action out of the groove portions to the intersticial spaces between the dielectric substrate and the heat sink. The indicator groove portions 310*d* and 312*b* readily tell whether the solder has been properly distributed. Additionally, should one of the grooves become occluded for any reason the groove portions 310*d* and 312*b* allow effluent solder to be drawn back under the dielectric substrate, flowing from unoccluded groove portions to any occluded or starved groove portion which is not feeding to the relief groove portion. The relief groove portions accordingly greatly improve the reliability with which uniform solder distribution is achieved. As fully described above in connection with the preceding embodiments of our invention the solder which underlies the dielectric substrate remains relatively free of oxygen. In FIG. 6 the residual, oxygen rich portion of the solder used to bond the dielectric substrate is shown at 314** adjacent the point of convergence.

As best seen in FIG. 6, on a major surface 316 remote from the heat sink the dielectric substrate is provided with laterally spaced conductive pads or contacts. The contact 318 is of larger areal extent and serves as a main current carrying contact while the contact 320 is of lesser areal extent and serves as a trigger signal or gate contact. A lateral spacing 322 is provided between the contacts.

As shown in dashed outline in FIG. 6 a semiconductive element 324 overlies the contacts 318 and 320. The semiconductive element may be identical to the semiconductive element 102 described with reference to the semiconductive device 100. In this circumstance the semiconductive element is located so that the bonding layer 132 cooperates with the contact 320 while the bonding layer 128 cooperates with the contact 318 with the junction 122 meeting the second major surface 106 within the lateral space 322 between the contacts. In the fabrication of the semiconductor device 300, however, the bonding layers comprise only the contacts attached to the semiconductive element and do not comprise the solder for bonding.

To facilitate soldering according to our invention a plurality of parallel groove portions 326 are associated with the main contact which meet with converging groove portions 328 having a point of convergence 330. Similarly, the gate contact is provided with a plurality of parallel groove portions 332 meeting with converging groove portions 334 having a point of convergence 336. It is to be noted that the points of convergence, the converging groove portions, and a portion of the parallel groove portions associated with each contact lie outside the area subtended by the semiconductive element.

The semiconductive element prior to bonding to the dielectric substrate may be provided with a current collector and lead 338 shown in FIG. 7. When the semiconductive element 324 is identical to the semiconductive element 102, the lead 338 serves as the anode lead and is bonded to the anode emitter layer of the semiconductive element. To bond the semiconductive element to the dielectric substrate for heat rejection thereto and to allow for external lead interconnections, the semiconductive element together with a gate lead 340 and a cathode lead 342 are positioned as shown in FIG. 7. A solder ball positioned at the point of convergence 330 when melted spreads solder through the converging groove portions 328 to the parallel groove portions 326. It is to be noted that a single solder ball thus not only bonds the semiconductive element to the main current carrying contact of the dielectric substrate, but also simultaneously bonds the cathode lead 342 to this same contact. A second solder ball positioned at the point of convergence 336 similarly spreads solder through the parallel groove portions 332 beneath the gate lead 340 and the portion of the semiconductive element surface which is formed by the cathode base layer. In both instances a tenacious, low impedance solder interconnection is formed having the advantages discussed with reference to preceding embodiments of our invention. After soldering is completed a plastic housing 344 may be molded to cooperate with the heat sink and encapsulate the semiconductive element and dielectric substrate.

The importance of the improved fabricating process of our invention to the semiconductor device 300 is readily appreciated when it is considered that heat in passing from the semiconductive element 324 to the heat sink 302 must pass through the solder interconnections to contacts 318 and 320 to reach the dielectric substrate 316, through the dielectric substrate, and through the solder interconnection between the heat sink and substrate. Even with the best practical choice of dielectric substrate this element will represent a significant impedance to heat flow. Additionally, heat must flow through two serially related solder joints. Accordingly, in order to avoid drastically derating the device it is essential that both the solder joints exhibit a low impedance to heat flow. With our invention this objective is obtained. At the same time it is to be noted that in conducting electricity from the cathode emitter layer of the semiconductive element to the cathode lead 342 current must flow through a solder connection between the semiconductive element and the contact 318, laterally through the contact 318, and through the solder interconnection between the contact and the cathode lead. Thus, again two solder interconnection must be traversed in series. An advantage in fabrication of the semiconductor device 300 is that all the elements may be assembled in the relation shown in FIG. 7 and soldering completed in a single operation merely by supplying solder to the three points of convergence of the grooves. Hence our invention not only improves thermal and electrical reliability, but also allows for greater ease of device fabrication.

Figure 8:
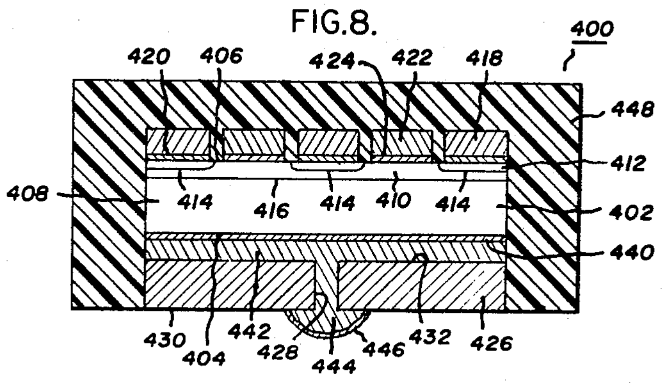
FIG. 8 is a partially schematic sectional view of a semiconductor device.

To further illustrate the diversity of our invention, in FIG. 8 a semiconductor device 400 is depicted including a semiconductive element 402 formed with a first major surface 404 and a second, opposed major surface 406. As shown the semiconductive element is formed of a collector zone 408 adjacent the first major surface and a base zone 410 and an emitter zone 412 adjacent the second major surface. An emitter junction 414 is located between the emitter and base zones while a collector junction 416 is located between the base and collector zones. An emitter connector 418 which may be integral with or conductively associated with an emitter lead is ohmically conductively associated with the emitter zone by bonding layer 420. A similar base connector 422 is ohmically conductively associated with the base zone by a bonding layer 424. The bonding layers 420 and 422 may be identical to bonding layers 128 and 132. The emitter and base zone connectors are shown interdigitated as is conventional practice for power transistors.

Figure 9:
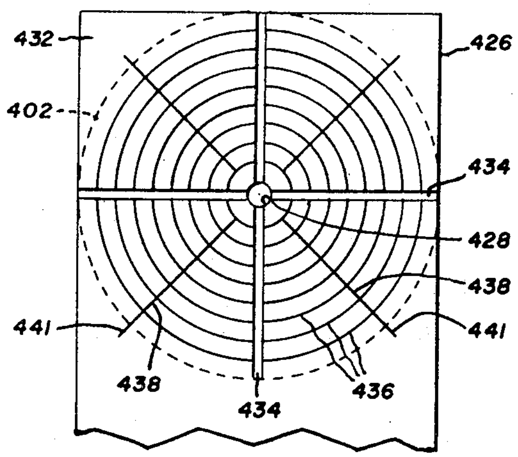
FIG. 9 is a plan view of the heat sink for the semiconductor device of FIG. 8.

A heat sink 426 is provided for mounting the transistor semiconductive element, providing an ohmic conductive connection to the collector zone, and for withdrawing heat from the semiconductive element. A plan view of the heat sink as it appears prior to mounting the semiconductive element thereto is shown in FIG. 9. The outline of the semiconductive element 402 is shown as a dashed line in FIG. 9. The heat sink is provided with a central aperture 428 extending between first major surface 430 intended to cooperate with a heat receiving body and a second major surface 432 which receives heat from the semiconductive element. A plurality of radial primary grooves 434 intersect the aperture adjacent the second major surface. A plurality of circumferential grooves 436 are positioned concentrically with the aperture and intersect the primary grooves. The circumferential grooves are smaller in cross-section than the primary grooves so that they offer a greater capillary attraction for solder. Radial secondary grooves 438 intersect the circumferential grooves mid-way between the primary grooves. The radial secondary grooves are provided with external indicator portions 441 that extend laterally beyond the area subtended by the semiconductive element.

The first major surface of the semiconductive element is provided with a contact 440. Solder 442 bonds the contact 440 and the first major surface to the heat sink. The solder extends into the grooves and the aperture. A portion of the solder forms a button 444 adjacent the second major surface of the heat sink. The button includes an oxide coating 446, whereas the remainder of the solder is relatively oxide free. A molded housing 448 surrounds the semiconductive element and cooperates with the heat sink.

To attach the semiconductive element 402 to the heat sink 426 these elements are associated as shown in FIG. 8, except that the first major surface 430 of the heat sink is preferably oriented to be uppermost—i.e., the elements are inverted from the position shown. Solder 442 associated with the heat sink upon melting is introduced through the aperture 428. The solder first spreads through the primary radial grooves 434 to enter circumferential secondary grooves 436, which offer a greater capillary attraction for the solder. Solder also spreads by capillary action to the interstices between the heat sink and semiconductive element, so that solder becomes associated with the entire surface of the contact 440. Solder enters the radial capillaries 438 and spreads outwardly to the indicator portions 441. Since the indicator portions intersect and are fed by the secondary grooves at their most remote point from the primary grooves, solder emergence from the radial secondary grooves at the indicator portions is a reliable indication that the secondary grooves have been filled with solder. As the solder spreads through the aperture and capillaries only the relatively oxide free portion of the solder is distributed. The oxide coating 446 formed on the solder by air contact remains on the button 444. After the solder has hardened the button together with the oxide coating can be mechanically severed from the heat sink. This will also allow the first major surface 430 of the heat sink to be mounted flat with planar heat receiving surface.

Figure 10:
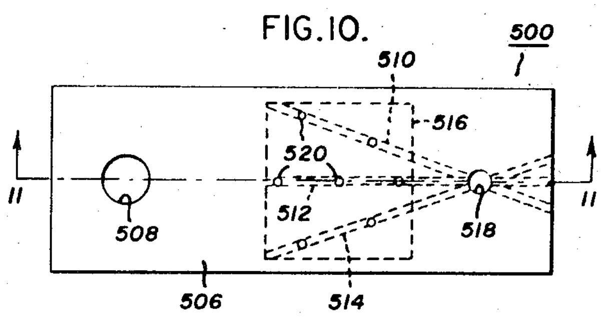
FIG. 10 is a plan view of a laterally apertured heat sink for a semiconductor device.
Figure 11:
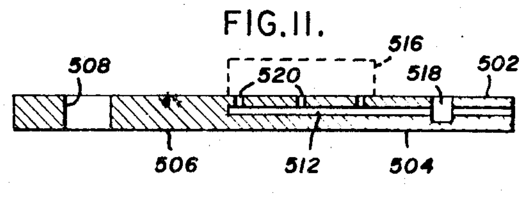
FIG. 11 is a section taken along section line 11—11 in FIG. 10.

FIGS. 10 and 11 show an alternate capillary construction. The heat sink 500 is provided with a first major surface 502 and an opposed, parallel major surface 504. The heat sink is provided with an integral tab portion 506 having an aperture 508 therein. The heat sink is shown formed with a plurality of laterally extending apertures 510, 512, and 514. These apertures extend to an edge of the heat sink remote from the tab portion. The lateral apertures intersect at a location remote from an areal portion of the heat sink which is to be subtended by a semiconductive element, shown by dashed lines 516. A solder feeding aperture 518 is formed to extend from the first major surface to intersect the lateral apertures. The solder feeding aperture is somewhat larger in diameter than the lateral apertures. A plurality of solder exuding apertures 520 of somewhat smaller diameter than the lateral apertures are formed in the heat sink extending from the first major surface to a point of intersection with the lateral apertures and located within an area to be subtended by the semiconductive element to be attached.

To attach a semiconductive element as indicated at 516 a solder ball may be introduced into the solder feeding aperture 518. The solder upon melting will be drawn laterally through the lateral apertures and from thence drawn into the solder exuding apertures 520 underneath the semiconductive element. The interstitial spacing between the heat sink and semiconductive element will draw solder by capillary action out of the apertures 520 so that ultimately the solder will bond between the first major surface of the heat sink and the mating major surface of the semiconductive element. As in the case of groove capillaries the oxide containing portions of the solder are left at or near the point of solder application and are not brought into contact with the semiconductive element or mating portions of the heat sink.

In soldering according to the capillary transport process of our invention we anticipate that gravity may be relied upon to assist in spreading the solder. For example, where relatively large grooves are employed gravity may be the primary spreading force. For most applications, however, we anticipate the use of comparatively small diameter grooves so that gravity is at best a secondary force. In fact, we have observed that solder may be spread according to our teachings in small capillaries against gravity without adverse effect.

We also anticipate that heat may be relied upon to assist in solder spreading. We have observed that capillary spreading can be enhanced and controlled by differential heating. By maintaining portions of capillaries remote from the point of solder application at a somewhat elevated temperature any tendency of the solder to lose fluidity and hence mobility prior to arriving at its desired destination may be offset. Devices with metal heat sinks may be most readily heated for soldering adjacent the location from which heat is to be dissipated. For example, heat sinks having tab portions may be most readily heated for soldering and capillary distribution of solder through the tab portions.

While we have described our invention with reference to certain preferred device embodiments, it is appreciated that numerous variations will readily occur to those skilled in the art. For example, while we have described the devices 100 and 300 with reference to thyristor semiconductive elements, it is appreciated that these device constructions are applicable to rectifier semiconductive elements generally as well as power transistor semiconductive elements. While we have disclosed our devices as having molded housings, it is appreciated that our invention can be applied to device constructions in which hermetically sealed metal housings are employed.

What we claim and desire to secure by Letters Patent of the United States is:

1. A semiconductor device comprising
substrate means providing an electrically and thermally conductive flat planar surface,
a semiconductive element mounted on said substrate having a flat planar first major surface facing said substrate surface,
an electrically and thermally conductive contact on said first major surface,
capillary passages in said substrate extending from a point outside the periphery of said semiconductive element thereon to a location interposed between said substrate means and said semiconductive element, the entirety of the surface portions of said substrate between said capillaries being flat and in opposed face-to-face contact with said semiconductive element flat first major surface for enhanced heat transfer therebetween, and
solder means located within said capillary means and bonding said contact to said substrate means.

2. A semiconductor device according to claim 1 in which said capillary means define a plurality of grooves in said substrate means.

3. A semiconductor device according to claim 1 in which said capillary means converge at a point remote from said semiconductive element.

4. A semiconductor device according to claim 1 in which said capillary means converge at a point remote from said semiconductive element, a residual portion of said solder means is located at the convergence, an oxide film is associated with said residual portion of said solder means at said convergence, and said solder means underlying said semiconductive element is relatively free of oxide associated therewith.

5. A semiconductor device according to claim 1 in which said capillary means extends from said semiconductive element to an indicator point separated from said remote point by said semiconductive element, a residual portion of said solder means is associated with said capillary means adjacent said remote point and a leading portion of said solder means is associated with said capillary means adjacent said indicator point.

* * * * *